United States Patent [19]
Choi et al.

[11] Patent Number: 5,869,375
[45] Date of Patent: Feb. 9, 1999

[54] TRANSISTOR FABRICATION METHOD

[75] Inventors: Jong-Moon Choi; Young Jin Song, both of Seoul; Chang Reol Kim, Cheongju, all of Rep. of Korea

[73] Assignee: LG Semicon Co., Ltd., Choogcheongbuk-Do, Rep. of Korea

[21] Appl. No.: 796,038

[22] Filed: Feb. 5, 1997

[30] Foreign Application Priority Data

Feb. 5, 1996 [KR] Rep. of Korea .................... 2734/1996

[51] Int. Cl.$^6$ .............................................. H01L 21/336
[52] U.S. Cl. ........................... 438/300; 438/269; 438/303
[58] Field of Search .................................... 438/300, 268, 438/269, 299, 301, 305, 306, 307

[56] References Cited

U.S. PATENT DOCUMENTS

| 5,093,275 | 3/1992 | Tasch, Jr. et al. | 438/303 |
| 5,168,072 | 12/1992 | Moslehi | 438/305 |
| 5,270,257 | 12/1993 | Shin | 438/589 |
| 5,371,026 | 12/1994 | Hayden et al. | 438/300 |
| 5,430,313 | 7/1995 | Kumagai et al. | 257/327 |

OTHER PUBLICATIONS

Shin'ichiro Kimura et al., "Short–Channel–Effect–Suppressed Sub–0.1–$\mu$m Grooved–Gate MOSFET's with W Gate", IEEE Transactions on Electron Devices, 42(1):94–99 (1995).

Primary Examiner—Michael Trinh
Attorney, Agent, or Firm—Morgan, Lewis & Bockius LLP

[57] ABSTRACT

A method for fabricating a transistor includes the steps of forming a gate insulation film on a substrate, forming a gate electrode on the gate insulation film and forming a first insulation film pattern on the gate electrode. A side wall spacer is formed at side surfaces of the first insulation film pattern and the gate electrode. The gate insulation film is etched to expose a portion of a surface of the substrate. An epitaxial layer is formed on the substrate where the gate insulation film is etched. The side wall spacer is removed and a thermal oxide film is grown on a portion corresponding to where the side wall spacer is removed and on an upper portion of the epitaxial layer. A source/drain region is formed by ion-implanting an impurity into the epitaxial layer.

13 Claims, 5 Drawing Sheets

TRANSISTOR FABRICATION METHOD

BACKGROUND OF THE INVENTION

1. Field of the Invention

The present invention relates to a method for fabricating a transistor, and more particularly, to a method for fabricating a transistor having an elevated source/drain construction.

2. Discussion of the Related Art

A conventional elevated source/drain transistor is shown in FIGS. 1A through 1D.

Referring to FIG. 1A, a conventional elevated source/drain transistor includes a gate insulation film 12 formed on a silicon substrate 10. A poly-silicon film 14 is deposited on the gate insulation film 12. The poly-silicon film 14 is etched so as to expose a predetermined portion of the gate insulation film 12. Thus, a poly-silicon gate 14' is formed, as shown on FIG. 1B. An oxide film (first insulation film 16) is deposited on the gate insulation film 12 and the gate 14' through a chemical vapor deposition method.

Thereafter, as shown in FIG. 1C, a first insulation side wall spacer 16' is formed at a side surface of the poly-silicon gate 14' by etching-back the first insulation film 16 without using a mask. A predetermined portion of the surface of the silicon substrate 10 is exposed by etching a corresponding portion of the gate insulation film using the first insulation side wall spacer 16' as a mask.

Next, as shown in FIG. 1D, an epitaxial layer is selectively deposited on the surface of the exposed silicon substrate 10, and a source/drain 18 is formed by ion-implanting $n^+$ or $p^+$ impurity into the deposited epitaxial layer.

However, the transistor fabricated in the above-explained method has a disadvantage in that a short channel effect may occur due a pattern size reduction as the integration scale of the semiconductor device becomes larger.

SUMMARY OF THE INVENTION

Accordingly, the present invention is directed to a transistor fabrication method that substantially obviates one or more of the problems due to limitations and disadvantages of the related art.

An object of the present invention is the provision of a transistor fabrication method capable of preventing a short channel effect.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the present invention includes a method for fabricating a transistor comprising the steps of forming a gate insulation film on a substrate; forming a gate electrode on the gate insulation film on a substrate and forming a first insulation film pattern on the gate electrode; forming a side wall spacer at side surfaces of the first insulation film pattern and the gate electrode; etching the gate insulation film and exposing a portion of a surface of the substrate; forming an epitaxial layer on the substrate where the gate insulation film is etched; removing the side wall spacer; growing a thermal oxide film on a portion corresponding to where the side wall spacer is removed and on an upper portion of the epitaxial layer; and forming a source/drain region by ion-implanting an impurity into the epitaxial layer.

In another aspect, the present invention includes the method for fabricating a transistor including the steps of forming a gate insulation film on a substrate; forming a gate electrode on the gate insulation film and forming a first insulation film pattern on the gate electrode; forming a side wall spacer on side surfaces of the gate electrode and the first insulation film pattern and exposing a portion of a surface of the substrate; growing an epitaxial layer on the exposed substrate; and forming a source/drain by ion-implanting an impurity into the epitaxial layer.

In another aspect, the present invention includes a transistor fabricating method including a first step for forming a gate electrode on a gate insulation film on a substrate and a first insulation film pattern on the gate electrode; a second step for forming a side wall spacer at side surfaces of the first insulation film pattern and the gate electrode; a third step for etching a gate insulation film so as to expose a predetermined surface at the left and right sides of the side wall spacer; a fourth step forming an epitaxial layer on the substrate on which the surface is exposed; a fifth step for removing the side wall spacer; a sixth step for growing a thermal oxide film on a predetermined portion on which the side wall spacer is removed and on an upper portion of the epitaxial layer; and a seventh step for forming a source/drain region by ion-implanting an impurity into the epitaxial layer.

In a further aspect, the present invention includes a transistor fabrication method including a first step for forming a gate electrode on a gate insulation film on a substrate and on a first insulation pattern on the gate electrode; a second step for forming a side wall spacer on side surfaces of the gate electrode and the first insulation film pattern so as to expose a predetermined surface of the substrate; a third step for growing an epitaxial layer on the exposed substrate; and a fourth step for forming a source/drain by ion-implanting an impurity into the epitaxial layer to restrict a short channel effect of the semiconductor device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A transistor fabrication method of the present invention is basically directed to fabricating a transistor having a channel formed at a side wall of a gate and at a lower portion to prevent a short channel effect which may occur as the scale of integration of the semiconductor device becomes larger.

The transistor fabrication method in one embodiment of the present invention will now be explained with reference to FIGS. 2A through 2F.

Figure 1A:
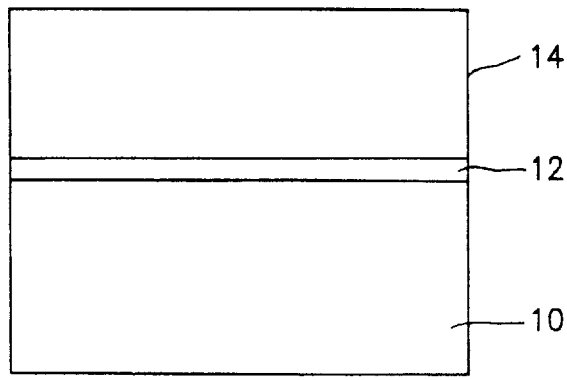
FIGS. 1A through 1D are cross-sectional views showing a fabrication process of a conventional transistor.
Figure 1B:
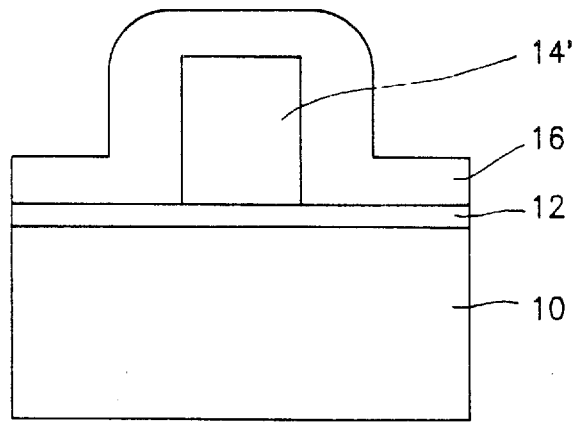
Figure 1C:
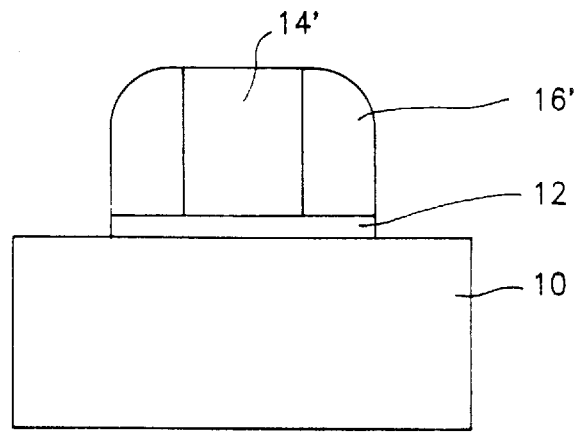
Figure 1D:
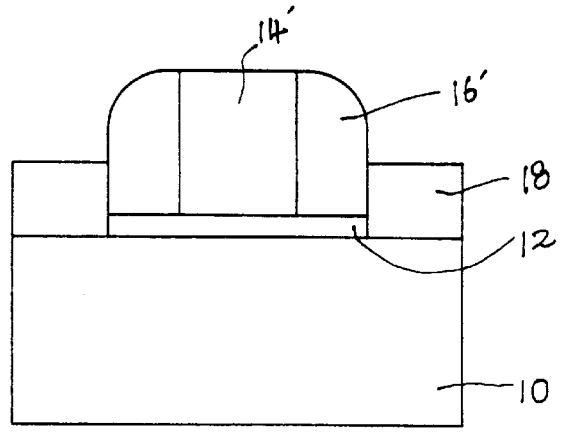
Figure 2A:
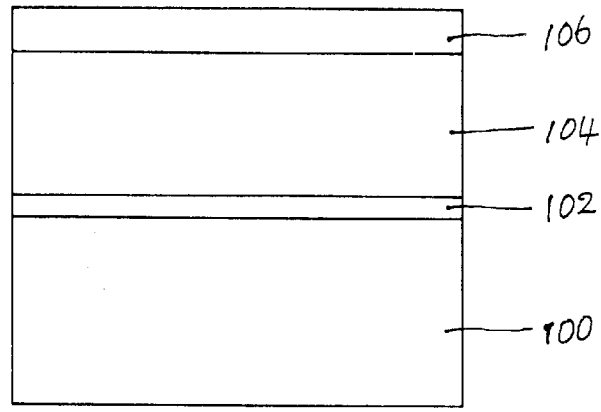
FIGS. 2A through 2F are cross-sectional views showing a fabrication process of a transistor in one embodiment of the present invention.

As shown in FIG. 2A, a gate insulation film 102 is formed on a silicon substrate 100, and a tungsten film 104 is deposited on the gate insulation film 102. An oxide film (first insulation film 106) is deposited on the tungsten film 104.

Figure 2B:
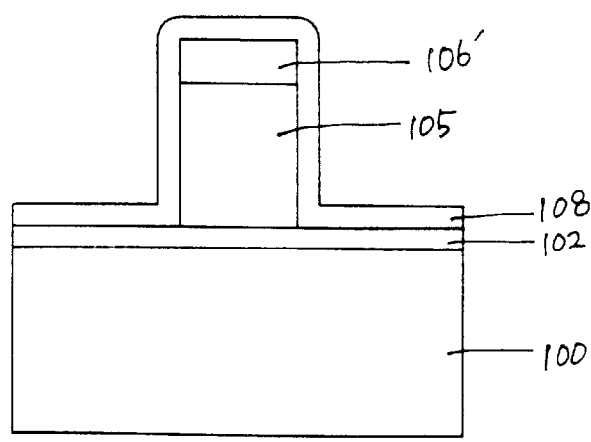

Thereafter, as shown in FIG. 2B, the first insulation film 106 and the tungsten film 104 are etched to expose a predetermined portion of the gate insulation film 102 through a photolithography process using a photosensitive film as a mask. As a result, a first insulation film pattern 106' and a gate electrode 105 are formed. A nitride film 108 is deposited on the entire surface of the gate insulation film 102 including the first insulation pattern 106' and the gate electrode 105.

Figure 2C:
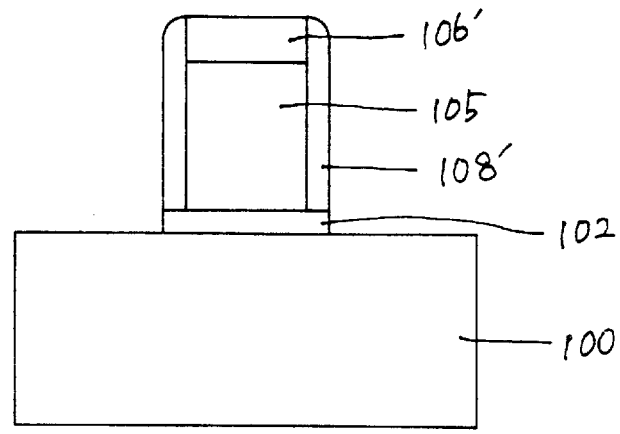

Next, as shown in FIG. 2C, a nitride side wall spacer 108' is formed at side surfaces of the first insulation film pattern 106' and the gate electrode 105 by etching-back the nitride film 108 without a mask. Then, a predetermined surface of the silicon substrate 100 is exposed by etching the gate insulation film 102 at the left and right sides thereof using the nitride film side wall spacer 108' as a mask.

Figure 2D:
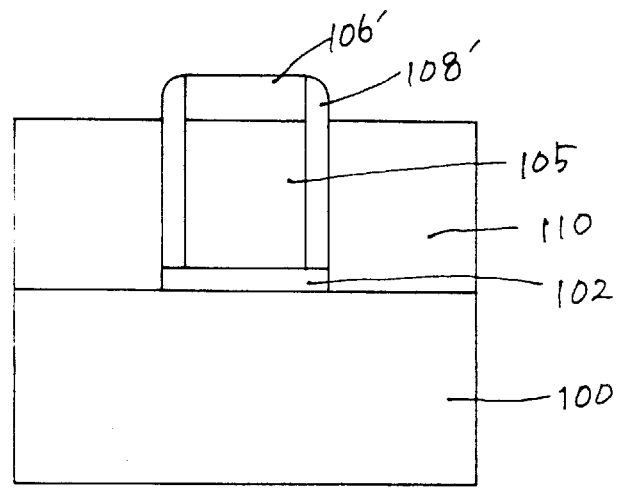
Figure 2E:
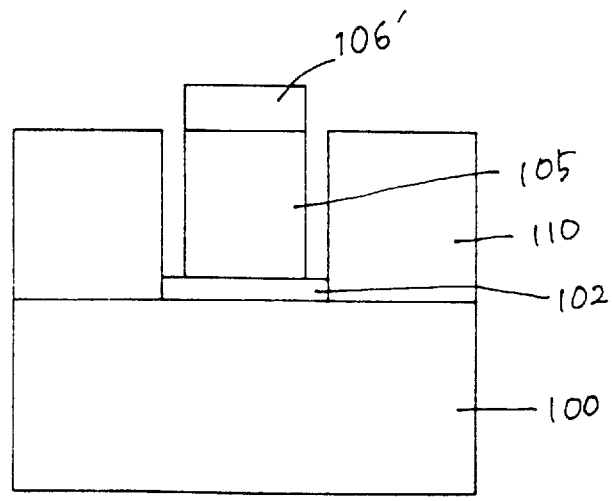

As shown in FIG. 2D, an epitaxial layer 110 is selectively grown on the surface of the exposed silicon substrate 100 to have the same height as the gate electrode 105. In addition, as shown in FIG. 2E, the nitride side wall spacer 108' is removed using a solution such as $H_3PO_4$ and other equivalents.

Figure 2F:
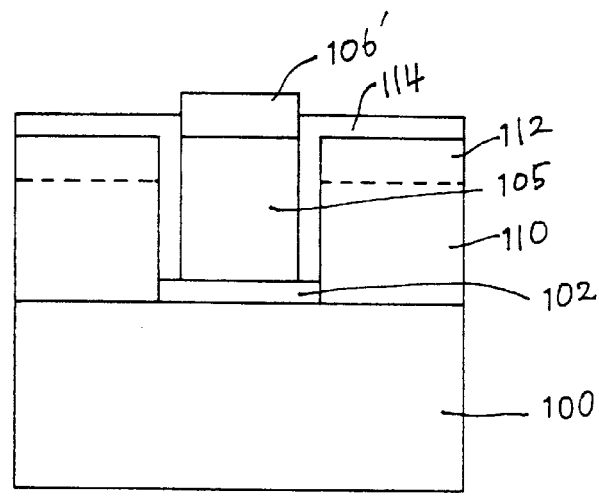

As shown in FIG. 2F, the silicon is thermal-oxidized in a furnace, and a thermal oxide film 114 is grown on a predetermined portion (where the nitride film side wall spacer 108' was removed) of a side surface of the gate electrode 105 and the epitaxial layer 110. An $n^+$ or a $p^+$ source/drain 112 is formed by ion-implanting an $n^+$ or a $p^+$ impurity into the epitaxial layer 110, thus completing the transistor fabrication process. When implanting the $n^+$ or $p^+$ impurity thereunto, the desired source/drain may be formed after forming an LLD (lightly doped drain) by controlling ion implantation energy and dose thereof.

When the transistor is fabricated in the above-mentioned process, since the thermal oxide film 114 formed at a side wall of the gate electrode 105 acts as a gate insulation film, the transistor acts as a transistor having a channel formed at a side surface as well as at a lower portion of the gate electrode 105. That is, it is possible to fabricate a transistor having a lengthy channel with respect to the same surface.

Moreover, the gate electrode is formed using a tungsten film having a high refractory characteristic which enhances the quality of the gate insulation film since the tungsten has a strong anti-oxide property during the thermal-oxidation process.

A transistor fabrication method in another embodiment of the present invention will now be explained with reference to FIGS. 3A through 3D.

Figure 3A:
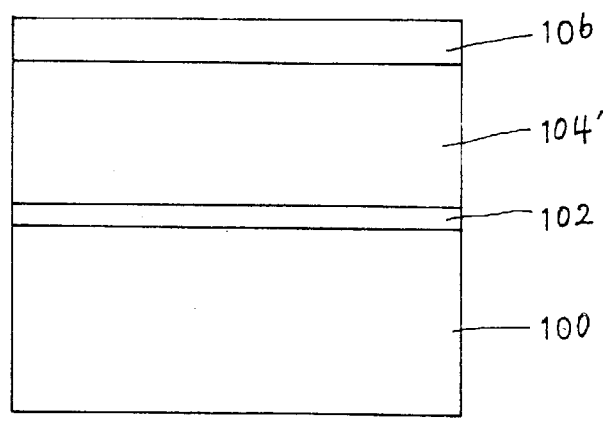
FIGS. 3A through 3D are cross-sectional views showing another fabrication process of a transistor in another embodiment of the present invention.

As shown in FIG. 3A, a gate insulation film 102 is formed on a silicon substrate 100, a poly-silicon film 104 is formed on the gate insulation film 102, and an oxide film (first insulation film 106) is formed on the poly-silicon film 104.

Figure 3B:
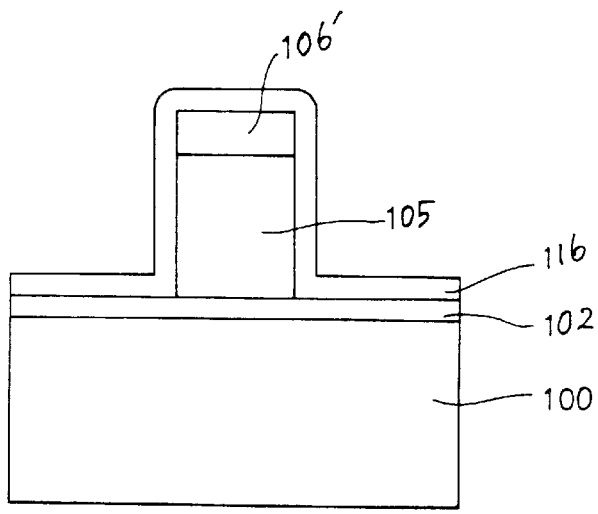

Next, as shown in FIG. 3B, the first insulation film 106 and the poly-silicon film 104 are etched so as to expose a predetermined surface of the gate insulation film 102 through a photolithography process using a photosensitive film as a mask. A first insulation film pattern 106' and a gate electrode 105 are thus formed. A second insulation film 116 is deposited on the entire surface of the gate insulation film 102, the first insulation pattern 106', and the gate electrode 105. Here, the second insulation film 116 is formed either with an oxide film which is deposited in a chemical vapor deposition or with a dielectric film such as $Ta_2O_5$ and other equivalents.

Figure 3C:
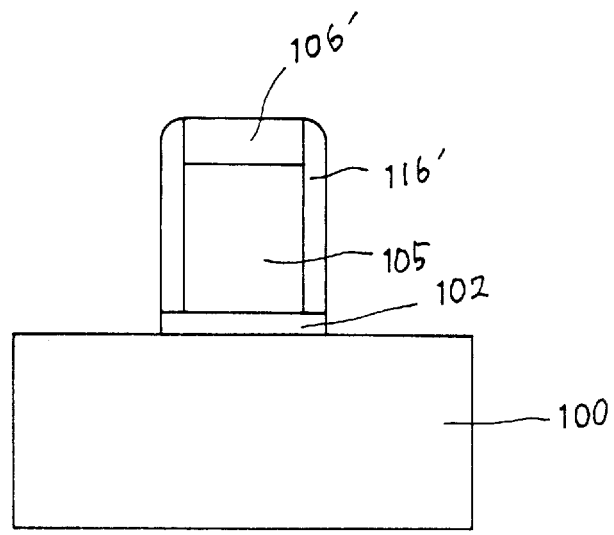

Thereafter, as shown in FIG. 3C, the second insulation film 116 and the gate insulation film 102 are etched-back without a mask, and a second insulation side wall spacer 116' is formed at side surfaces of the first insulation film pattern 106' and the gate electrode 105. Thus, a predetermined surface of the silicon substrate 100 is exposed.

Figure 3D:
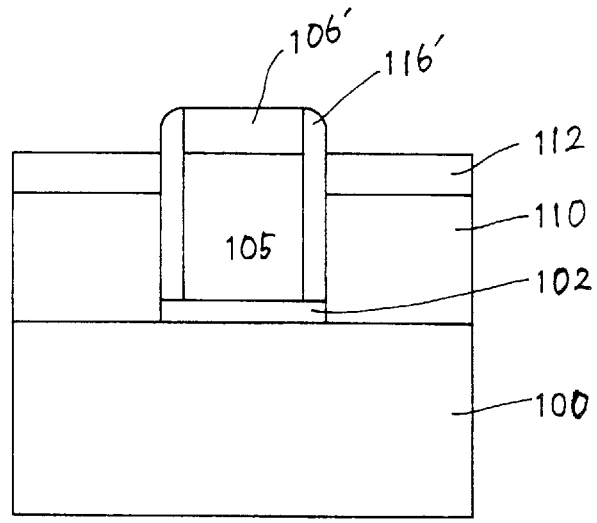

As shown in FIG. 3D, an epitaxial layer 110 is selectively grown on the exposed surface of the silicon substrate 100 and to the same height as the gate electrode 105. An $n^+$ or a $p^+$ source/drain 112 is formed by ion-implanting an $n^+$ or a $p^+$ impurity into the epitaxial layer 110, thus completing the transistor fabrication process. Here, when implanting the $n^+$ or $p^+$ thereunto, the source/drain may be formed by forming an LDD by controlling ion implantation energy and dose thereof and by performing an ion implantation again.

In this case, since the side wall spacer of the second insulation film 116' formed at a side surface of the gate electrode 105 acts as a gate insulation film, a desired transistor having a channel formed at a side surface and at a lower portion of the gate 105 can be obtained. That is, with the above-mentioned transistor, it is possible to restrict a short channel effect by forming a transistor having a lengthy channel with respect to the same surface.

Accordingly, the present invention provides an improved transistor fabrication method capable of preventing a short channel effect by fabricating a transistor having a channel formed at a side wall of the gate and a lower portion and by lengthening the channel.

As described above, the transistor fabrication method of the present invention has the advantages as follows:

First, since it is possible to form a substrate having different dopant densities at a lower channel side and a side surface channel side of the gate, a desired punch-through voltage can be achieved at the substrate (silicon substrate) at a channel side below the gate having a high dopant density. Moreover, it is possible to reduce a leakage current at a predetermined portion where a channel and an LDD region contact with each other at the substrate (an epitaxial layer) at a gate side surface where the dopant density is low.

Second, since a thermal oxide film is used as a gate insulation film, it is possible to enhance the quality of the gate insulation film.

Third, since a channel is formed at a gate side surface and at a lower portion and since it is possible to form a transistor having a lengthy channel with respect to the same surface, it is also possible to fabricate a high reliability transistor, which is capable of effectively restricting short channel effect.

It will be apparent to those skilled in the art that various modifications and variations can be made in the transistor fabrication method of the present invention without departing from the spirit or scope of the invention. Thus, it is intended that the present invention cover the modifications and variations of this invention provided they come within the scope of the appended claims and their equivalents.

What is claimed is:

1. A method for fabricating a transistor, comprising the steps of:

forming a gate insulation film on a substrate;

forming a gate electrode of a refractory metal on the gate insulation film and forming a first insulation film pattern on the gate electrode;

forming a side wall spacer at side surfaces of the first insulation film pattern and the gate electrode;

etching the gate insulation film and exposing a portion of a surface of the substrate;

forming an epitaxial layer on the substrate where the gate insulation film is etched;

removing the side wall spacer;

growing a thermal silicon oxide film on a portion corresponding to where the side wall spacer is removed and on an upper portion of the epitaxial layer by oxidizing the epitaxial layer; and forming source and drain regions by ion-implanting impurity ions into the epitaxial layer, wherein a channel is formed in the epitaxial layer between the substrate and one of the source and drain regions and also in a top surface of the substrate corresponding to a bottom surface of the gate electrode.

2. The method according to claim 1, wherein the gate electrode formed of a refractory metal includes tungsten.

3. The method according to claim 1, further including the step of forming a lightly doped drain region within the epitaxial layer after growing the thermal silicon oxide film.

4. The method according to claim 1, wherein the step of forming the side wall spacer includes the steps of:

forming a nitride film on surfaces of the gate insulation film, the first insulation film pattern, and the gate electrode; and etching-back the nitride film.

5. The method according to claim 1, wherein the removing step removes the side wall spacer using an $H_3PO_4$ solution.

6. The method according to claim 1, wherein the step of etching the gate insulation film exposes the substrate surface at left and right sides of the side wall spacer.

7. A method for fabricating a transistor comprising the steps of:

forming a gate insulation film on a substrate;

forming a gate electrode of a refractory metal on the gate insulation film and forming a first insulation film pattern on the gate electrode;

forming a side wall spacer on side surfaces of the gate electrode and the first insulation film pattern and exposing a portion of a surface of the substrate;

growing an epitaxial layer on the exposed substrate; and forming a source and drain by ion-implanting impurity ions into the epitaxial layer, wherein a channel is formed in the epitaxial layer between the substrate and one of the source and drain and also in a top surface of the substrate corresponding to a bottom surface of the gate electrode.

8. The method according to claim 7, wherein the side wall spacer is formed with an oxide film.

9. The method according to claim 7, wherein the side wall spacer is formed with a dielectric film.

10. The method according to claim 9, wherein the dielectric film is formed with $Ta_2O_5$.

11. The method according to claim 7, further including the step of forming a lightly doped drain region within the epitaxial layer.

12. The method according to claim 7, wherein the step of forming the side wall spacer include the steps of:

forming a second insulation film on surfaces of the gate insulation film, the first insulation film pattern, and the gate electrode; and etching-back the second insulation film and the gate insulation film.

13. A method for fabricating a transistor, comprising the steps of:

forming a gate insulation film on a substrate;

forming a gate electrode on the gate insulation film and forming a first insulation film pattern on the gate electrode;

forming a side wall spacer at side surfaces of the first insulation film pattern and the gate electrode;

etching the gate insulation film and exposing a portion of a surface of the substrate;

forming an epitaxial layer on the substrate where the gate insulation film is etched;

removing the side wall spacer;

growing a thermal oxide film on a portion corresponding to where the side wall spacer is removed and simultaneously on an upper portion of the epitaxial layer; and forming source and drain regions by ion-implanting impurity ions into the epitaxial layer, wherein a channel is formed in the epitaxial layer between the substrate and one of the source and drain regions and also in a top surface of the substrate corresponding to a bottom surface of the gate electrode.

* * * * *